CIRCUIT FOR EXTENDING BANDWIDTH OF A MODULATED AMPLIFIER

Filed July 17, 1964 3 Sheets-Sheet 1

INVENTOR.
RONALD J. ROCKWELL
BY Alden D. Redfield
Charles M. Hogan
ATTORNEYS.

PRIOR ART CIRCUIT

INVENTOR.
RONALD J. ROCKWELL
BY Alden D. Redfield
Charles M. Hogan
ATTORNEYS.

High Frequency Portion of Open Circuit Feedback Characteristic

INVENTOR.
RONALD J. ROCKWELL
BY Alden D. Redfield
Charles M. Hogan
ATTORNEYS.

3,316,504

CIRCUIT FOR EXTENDING BANDWIDTH OF A MODULATED AMPLIFIER

Ronald J. Rockwell, Cincinnati, Ohio, assignor to Crosley Broadcasting Corporation, Cincinnati, Ohio, a corporation of Ohio Filed July 17, 1964, Ser. No. 383,435
4 Claims. (Cl. 332—60)

The present invention relates to modulated amplifiers, and, more specifically, it provides an improvement circuit in the form of means for extending the bandwidth of a plate-modulated amplifier.

Referring for the present to FIG. 1, there is shown that portion of the circuitry of a conventional single-ended plate-modulated amplifier which raises problems and limitations solved and avoided by the improvement in accordance with the invention. In view of the extensive use of plate modulation of class C amplifiers in amplitude-modulated wave broadcasting, the art is thoroughly familiar with such amplifiers per se. They are based on the principle that a modulation voltage corresponding to the signal intelligence is superimposed upon the direct current anode supply voltage of a class C amplifier, so that the resultant plate supply voltage of the amplifier, alternating current-wise, varies in accordance with the desired modulation envelope. That is, making reference to FIG. 1, a modulating voltage is applied between the terminals 10 and 11 of a class C radio frequency amplifier stage including a triode 12. That is to say, the modulating voltage is effectively applied between plate and cathode of class C amplifier tube 12. The radio frequency exciting voltage or carrier is applied across terminals 13 and 11—i.e., between control electrode and cathode. Disposed across the cathode-plate circuit is a tank circuit comprising the parallel combination of a tuning capacitor 14 and an inductor 15, a radio frequency coupling capacitor 16 being inserted between the tank circuit and the anode of the modulated amplifier. The modulated radio frequency output appears across secondary 18, which is coupled to inductor 15 of the tank circuit.

The modulating signal applied between terminals 10 and 11 is usually produced by a class B power amplifier (not shown), and the output of this power amplifier is generally introduced through a transformer into the input terminals 10, 11 of the modulated amplifier. Interposed between the secondary of the modulating transformer (not shown) and the anode of triode 12 is a radio frequency choke 17, which offers a high impedance to radio frequency voltages but constitutes a low impedance to the modulating or signal or intelligence frequencies. On the other hand, the coupling capacitor 16 constitutes a low impedance at radio frequencies but offers a high impedance to the modulating frequencies.

Reference is made to Fig. 15.2 of Electronic and Radio Engineering, Terman, page 526, McGraw-Hill, New York (1955), and the accompanying discussion at pages 525–531 for a complete description and discussion of plate-modulated amplifiers of the type under consideration.

In conventional modulated amplifiers the ability to modulate at high frequencies is limited at the series resonant frequency of the choke coil 17 and the capacitor 16. To give an example, in a typical 50 kilowatt amplifier a choke of 2.5 microhenries and a capacitor of approximately 0.002 microfarad may be employed. This combination series resonates at approximately 70 kilocycles and effectively presents a short circuit across the modulation loop at a most important portion of the feedback frequency characteristic, causing the transmitter to generate spurious oscillations.

Further explaining the expression "loop" as used in the preceding paragraph, this entire discussion assumes that the modulated amplifiers being treated correspond to the block designated "Amplifier" at page 222, Fig. 88, of the Radio Engineers' Handbook, Terman, McGraw-Hill Book Company, New York (1943). At pages 222–225 of the Terman work, it is pointed out that, when negative feedback is used to control an amplifier over a range of audio frequencies, the characteristics of the negative feedback loop must be defined and controlled over a band of frequencies considerably wider than that in the signal channel. Using techniques described at pages 222–225 of the Terman Hankbook just cited, the transmission characteristics of the feedback loop are accordingly provided.

Now making reference to FIG. 5, there is there shown a feedback-frequency characteristic of a negative feedback loop included in a transmitter which comprises a plate-modulated amplifier of the type under consideration. The desired characteristic ABCDEF becomes unstable at point G due to the short-circuit effect discussed above, and the result is an unsatisfactory characteristic ABCGDEF.

This factor constitutes a serious limitation on the bandwidth of a modulated amplifier.

The principal object of the invention is to provide an improved modulated amplifier circuit in which this limitation with its accompanying disadvantages is avoided.

Another object of the present invention is to provide an amplitude-modulated amplifier in which the modulating signals are inserted at the ground end or ground center of the tank circuit at a point at which the radio frequency voltage is essentially zero.

An incidental object of the invention is to provide a more efficient and effective means for sampling the radio frequency voltage of the tank circuit of a modulated amplifier for the purpose of providing feedback voltage.

For a better understanding of the present invention, together with other and further objects, advantages, and capabilities thereof, reference is made to the following description of the appended drawings.

In each case the improvements are made in accordance with the invention.

Figure 5:
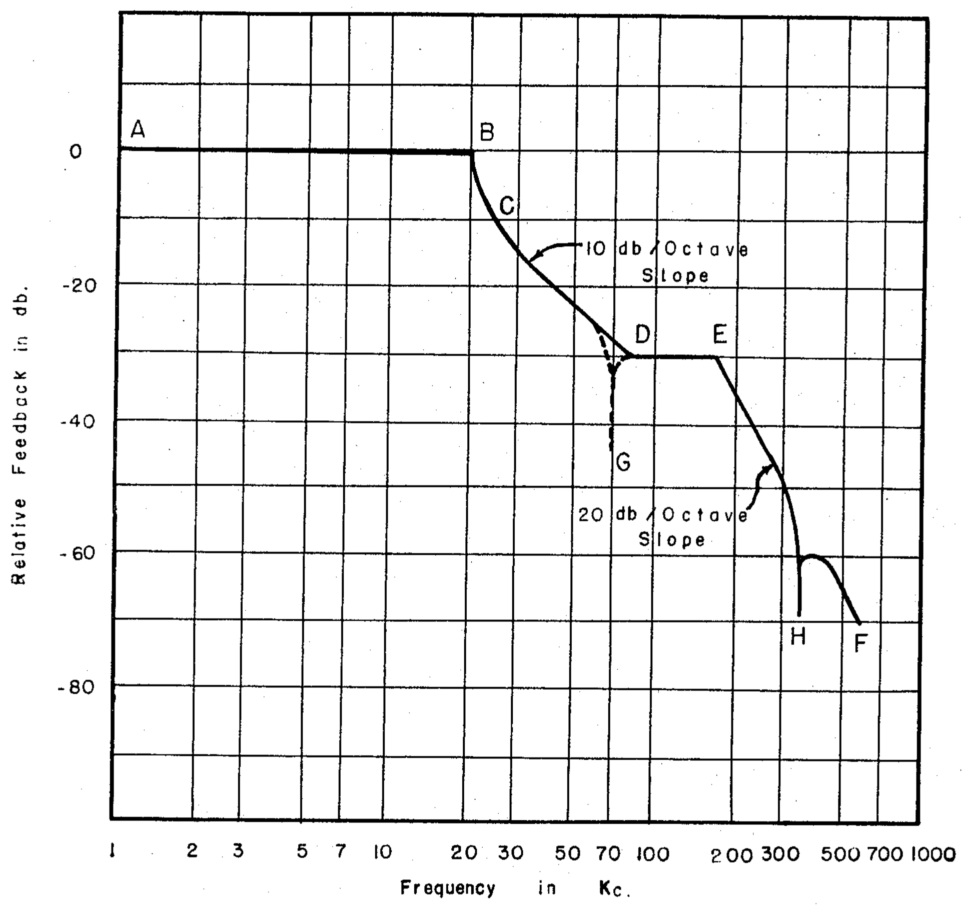

FIG. 5 is a feedback-frequency set of graphs of a transmitter having a negative feedback loop and including a plate-modulated amplifier, the shift of the portion at G over to H representing that which the invention accomplishes.

Figures 3, 4:
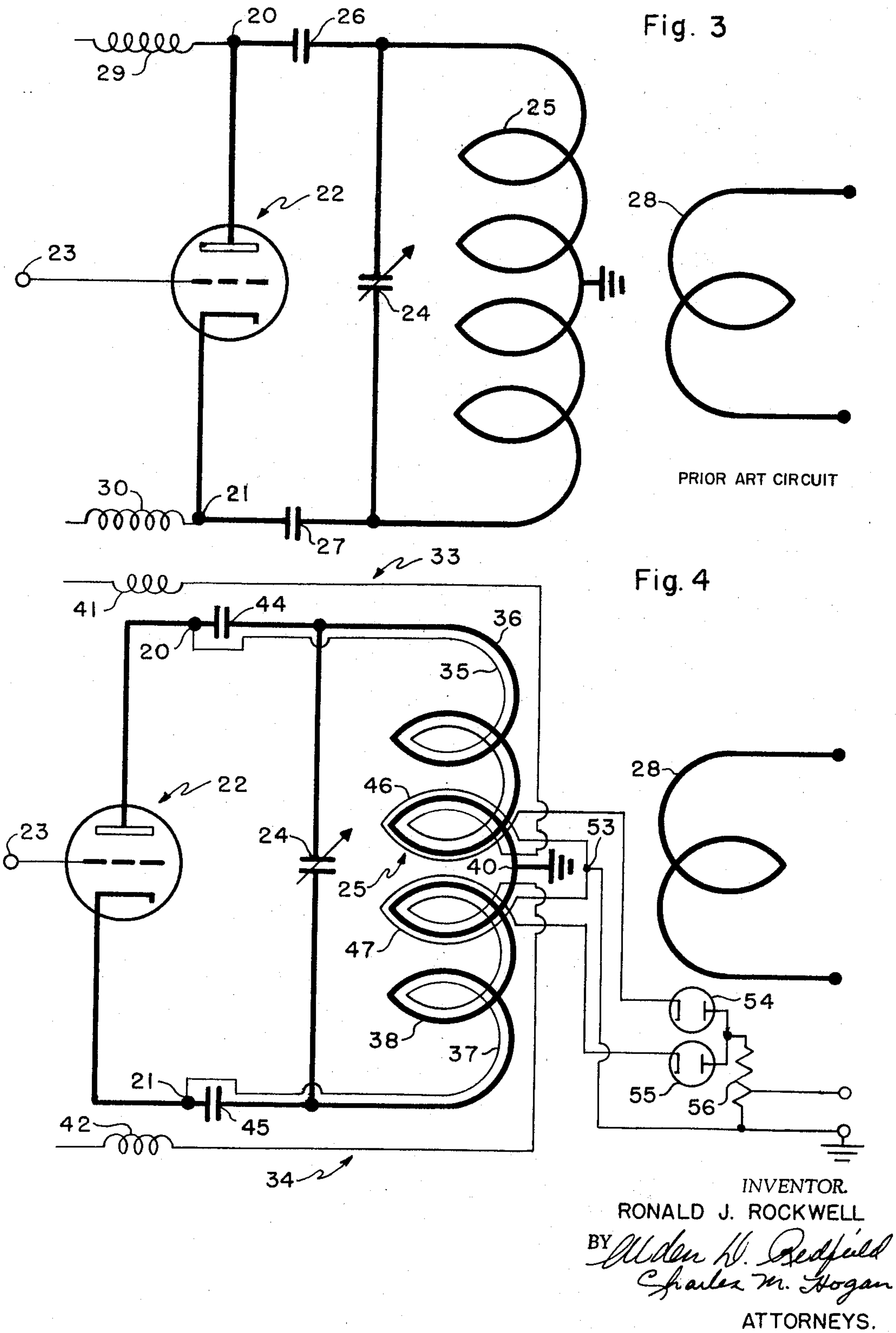
FIGS. 3 and 4 are schematic drawings of the pertinent portions of conventional and improved balanced plate-modulated amplifiers, respectively.

Referring now to FIG. 3, it comprises a plate-modulated amplifier of the type shown in the output of the circuit illustrated in U.S. Patent 2,711,512. In the circuit of FIG. 3 the modulating voltage is applied between the terminals 20 and 21 of a class C radio frequency amplifier stage including a triode 22, the modulating voltage being effectively applied between plate and cathode. The radio frequency exciting voltage or carrier is applied across terminals 23 and 21—i.e., between control electrode and cathode. Disposed across the cathode-plate circuit is a tank circuit comprising the parallel combination of a tuning capacitor 24 and an inductor 25, radio frequency coupling capacitors 26 and 27 being inserted between the tank circuit terminals and the anode and cathode, respectively, of triode 22. The modulated radio frequency output appears across secondary 28, which is coupled to inductor 25 of the tank circuit. The construction and operation of the FIG. 3 circuit are generally similar to FIG. 1, except that the FIG. 3 circuit is a balanced version.

The modulating signal applied between terminals 20 and 21 is usually produced by a class B power amplifier (not shown), and the output of this power amplifier is generally introduced through a transformer into the input terminals 20, 21 of the modulated amplifier. Interposed between the secondary terminals of the modulating transformer (not shown) and the anode and cathode of triode 22 are radio frequency chokes 29 and 30, which offer high impedances to radio frequency voltages but constitute low impedances to the modulating or signal or intelligence frequencies. On the other hand, the coupling capacitors 26 and 27 constitute low impedances at radio frequencies but offer high impedances to the modulating frequencies.

Figures 1, 2:
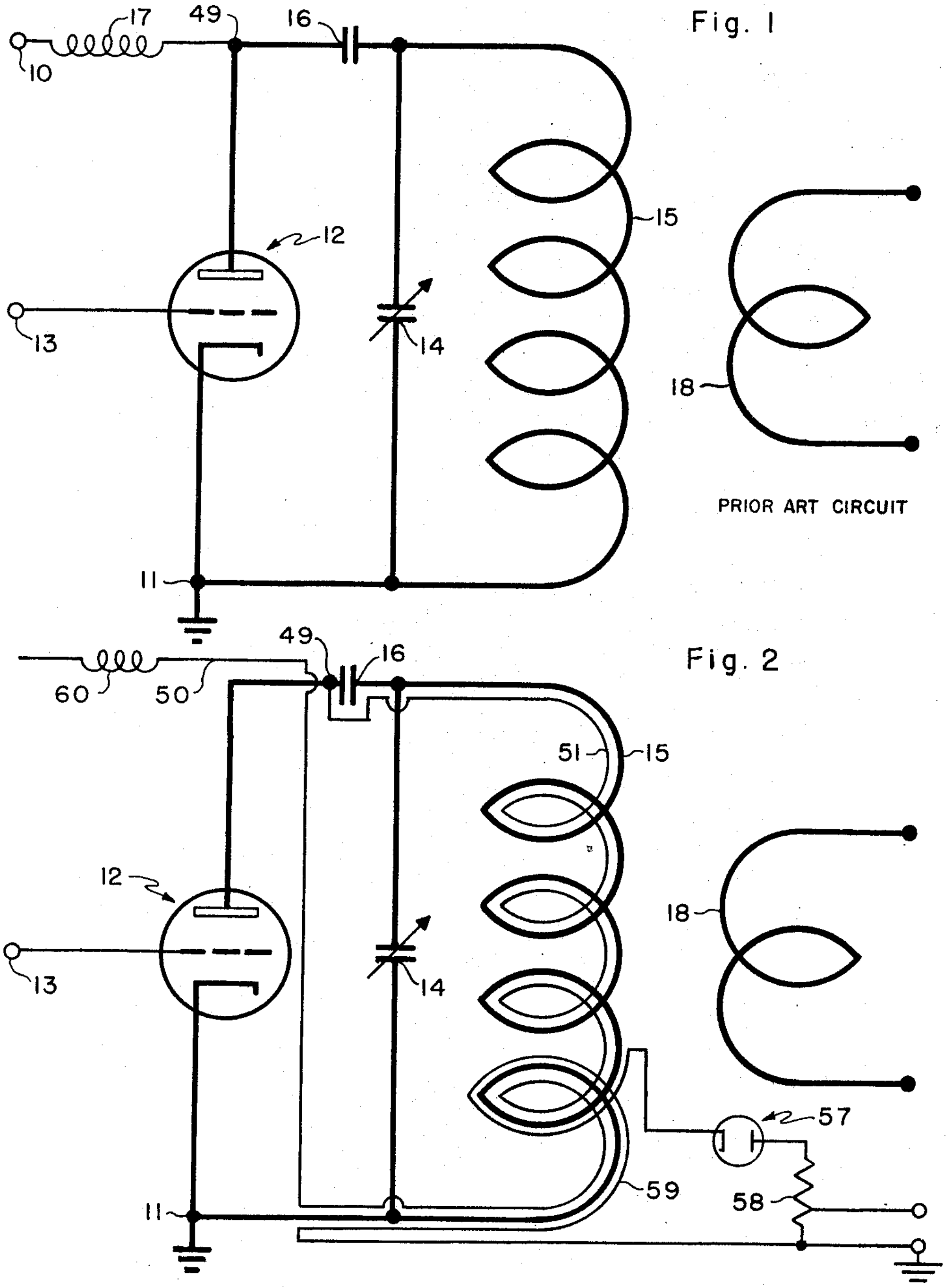
FIGS. 1 and 2 are schematic drawings of the pertinent portions of conventional and improved single-ended plate-modulated amplifiers, respectively.

The FIG. 3, or balanced, version of plate-modulated amplifier suffers from the same difficulty as the FIG. 1, or single-ended, version, in that the combination of the chokes 29 and 30 and the capacitors 26 and 27 and the tank circuit 24–25 series resonates and forms essentially a short circuit across the modulator at an important point of the open loop feedback-frequency characteristic (as shown in FIG. 5), causing the transmitter to generate spurious oscillations.

The disadvantages complained of above are eliminated, and the conventional circuits of FIGS. 1 and 3 are rendered free of such disadvantages, by the improvements illustrated in FIGS. 2 and 4.

The improvements of FIG. 4 are first described. The modulator is coupled to terminals 20 and 21 of the amplifier by conductive paths 33 and 34, respectively. The conductive path 33 includes a bifilar winding 35 which is very closely coupled to portion 36 of tank circuit inductor 25. Similarly, the conductive path 34 includes a bifilar winding 37 which is very closely coupled to portion 38 of inductor 25. The inductor sections 36 and 38 are connected to a common grounded tap 40, on which no radio frequency can exit. That is to say, the modulation power is inserted at the ground center of the tuned tank circuit whereat the radio frequency voltage is essentially zero. The result is achievement of the satisfactory characteristic ABCDEHF of FIG. 5. Essentially, the disturbing inverted pip has been moved outwardly to the 350 kilocycle range, where it is harmless.

The coupling of the bifilar windings to their respective tank circuit inductor portions is slightly less than one hundred percent, so that small chokes 41 and 42 are employed in the FIG. 4 embodiment in order to isolate any residual radio frequency voltages from the modulator. As indicated above, the series resonant frequency of these small chokes (approximately 100 microhenries) and the capacitors 44 and 45 causes the disturbance at H in FIG. 5, but this is harmless. In an experimental model of the FIG. 4 embodiment of the invention, the circuit has a 50 kilowatt capacity.

Physically, the 50 kilowatt tuned coil 25 is formed from ¾-inch silver plated soft copper tubing approximately 18 inches in diameter by 22 inches long, with seven and a half turns each side of center. This is tuned by a .0015 microfarad variable capacitor 24 to 700 kilocycles. The bifilar coils 35 and 37 are #14 stranded copper insulated for 60 kilovolts. These are taped against the inner periphery of the copper tubing coil 25, turn for turn. Elements 44 and 45 are .004 microfarad D.C. blocking capacitors. The feedback bifilar coil portions (46–47, described below) are similarly mounted.

In a similar manner the FIG. 1 single-ended modulated amplifier is improved as per FIG. 2. The modulation is applied to the anode terminal 49 via a conductive path 50 which includes a bifilar winding 51 very closely coupled to tank circuit inductor 15. There is no radio frequency at grounded point 11, and therefore no radio frequency at the point at which the modulation power is introduced into the modulated amplifier stage.

In the FIG. 2 circuit the coupling between the elements 51 and 15 is not quite one hundred percent, so that a small choke 60 (100 microhenries) is utilized in series with path 50.

The description now relates to an additional feature provided in accordance with the invention. Referring to FIG. 4, it has been stated that additional bifilar winding sections 46 and 47 are provided. Adjacent terminals of these two windings are brought out to a common terminal 53. The remaining terminals of these windings are separately connected to the cathodes of tubes 54 and 55 of a full-wave rectifier, and the anodes of these tubes are connected to a common output resistor 56 which is tapped to provide a source of rectified feedback voltage. In this manner the radio frequency voltage of the tank circuit is sampled with essentially no phase rotation, and the entire feedback is isolated, so far as conduction is concerned, from the tank circuit. This arrangement eliminates noise which would be present if the rectifier were directly connected to the tank circuit. A similar rectifier arrangement including tube 57 and output resistor 58 is illustrated in FIG. 2, wherein the additional bifilar winding 59 is connected to the cathode of half-wave rectifier tube 57.

The improvements provided in accordance with the invention greatly enlarge the bandwidth of the modulated amplifier and eliminate a source of noise.

While there have been shown and described what are at present considered to be the preferred embodiments of the invention, it will be obvious to those skilled in the art that various modifications and changes may be made therein without departing from the scope of the invention as defined by the appended claims.

I claim:

1. In a modulation system of the type comprising a source of modulating signals and a balanced plate-modulated device having an anode and cathode and including a tank circuit having an inductor provided with a center tap connected to a grounded point of fixed reference potential, the improvement which comprises:
   a pair of bifilar windings closely coupled to said inductor and having input portions located electrically in proximity to said point of reference potential and output portions separately coupled to said anode and cathode.

2. In a modulation system of the type comprising a source of modulating signals and a single-ended plate-modulated amplifier, including a tank circuit having an inductor provided with a terminal connected to a grounded point of fixed reference potential, the improvement which comprises:
   a single bifilar winding closely coupled to said inductor and having an input portion located electrically in proximity to said point of reference potential and an output portion connected to the plate of said modulated amplifier;
   and means for sampling the radio frequency output of the tank circuit, comprising another bifilar winding closely coupled to said inductor and having a portion electrically in proximity to said point of fixed reference potential, together with rectifier means coupled to said other bifilar winding.

3. In a modulation system of the type comprising a source of modulating signals and a balanced plate-modulated device having an anode and cathode and including a tank circuit having an inductor provided with a center tap connected to a grounded point of fixed reference potential, the improvement which comprises:
   a pair of bifilar windings closely coupled to said inductor and having input portions located electrically in proximity to said point of reference potential and output portions separately coupled to said anode and cathode;
   and means for sampling the radio frequency output of the tank circuit, comprising another pair of bifilar windings closely coupled to said inductor and having portions electrically in proximity to said grounded point, together with full-wave rectifier means coupled to said other pair of bifilar windings.

4. In a modulation system of the type comprising a source of modulating signals and a modulated amplifier having an anode and cathode and including a tank circuit consisting of a tuning capacitor and an inductor provided with a center tap connected to a grounded point of fixed reference potential, and blocking capacitors between said anode and cathode and said tank circuit, the improvement which comprises:

bifilar windings closely coupled to said inductor and having input portions located in proximity to said point of fixed reference potential and output portions separately connected to the junctions of said blocking capacitors with said anode and cathode.

References Cited by the Examiner

UNITED STATES PATENTS

| | | | |
|---|---|---|---|
| 1,848,126 | 3/1932 | Heising | 332—43 X |
| 2,298,099 | 10/1942 | Roberts | 332—60 X |
| 2,477,074 | 7/1949 | McIntosh | 330—122 X |

ROY LAKE, *Primary Examiner.*

ALFRED L. BRODY, *Examiner.*

UNITED STATES PATENT OFFICE

CERTIFICATE OF CORRECTION

Patent No. 3,316,504 April 25, 1967

Ronald J. Rockwell

It is hereby certified that error appears in the above numbered patent requiring correction and that the said Letters Patent should read as corrected below.

Column 3, line 39, for "exit" read -- exist --; column 4, line 42, after "portions" insert -- coupled to said source and --; line 43, before "point" insert -- grounded --; column 5, line 14, after "portions" insert -- coupled to said source and --.

Signed and sealed this 21st day of November 1967.

(SEAL)

Attest:

Edward M. Fletcher, Jr.

Attesting Officer

EDWARD J. BRENNER

Commissioner of Patents